United States Patent
Lin

(10) Patent No.: US 9,019,772 B1
(45) Date of Patent: Apr. 28, 2015

(54) IAS VOLTAGE GENERATOR FOR REFERENCE CELL AND BIAS VOLTAGE PROVIDING METHOD THEREFOR

(71) Applicant: Winbond Electronics Corp., Taichung (TW)

(72) Inventor: Hung-Hsueh Lin, Hsinchu County (TW)

(73) Assignee: Winbond Electronics Corp., Taichung (TW)

( * ) Notice: Subject to any disclaimer, the term of this patent is extended or adjusted under 35 U.S.C. 154(b) by 41 days.

(21) Appl. No.: 14/073,889

(22) Filed: Nov. 7, 2013

(51) Int. Cl.
*G11C 11/34* (2006.01)
*G11C 16/28* (2006.01)
*G11C 16/32* (2006.01)

(52) U.S. Cl.
CPC ................ *G11C 16/28* (2013.01); *G11C 16/32* (2013.01)

(58) Field of Classification Search
USPC ......................... 365/185.19, 185.21
See application file for complete search history.

(56) References Cited

U.S. PATENT DOCUMENTS 5,889,708 A * 3/1999 Hwang .................... 365/189.07

* cited by examiner

*Primary Examiner* — Fernando Hidalgo
(74) *Attorney, Agent, or Firm* — Jianq Chyun IP Office

(57) ABSTRACT

A bias voltage generator and generating method for a reference cell are provided. The bias voltage generator includes a data read detector, a cut-off signal generator and an output stage circuit. The data read detector generates a detection signal according to transition points of a sense amplifier enable signal and a sense amplifier latch signal. The cut-off signal generator delays the detection signal a delay time to generate a cut-off signal, wherein a start-up time of the cut-off signal is decided by the detection signal and the delay time. The output stage circuit starts or stops to provide a bias-voltage providing signal according to the cut-off signal.

20 Claims, 5 Drawing Sheets

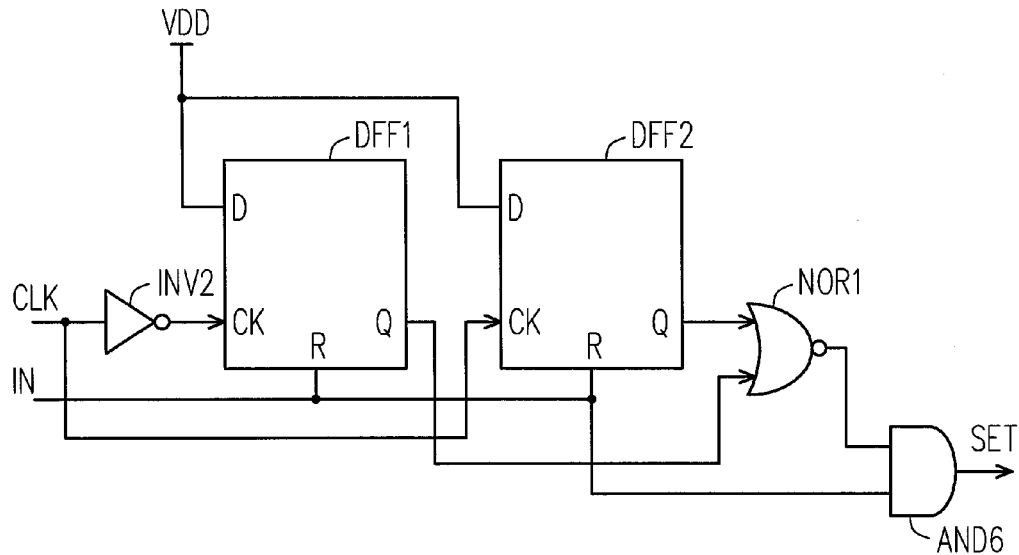
FIG. 3    211
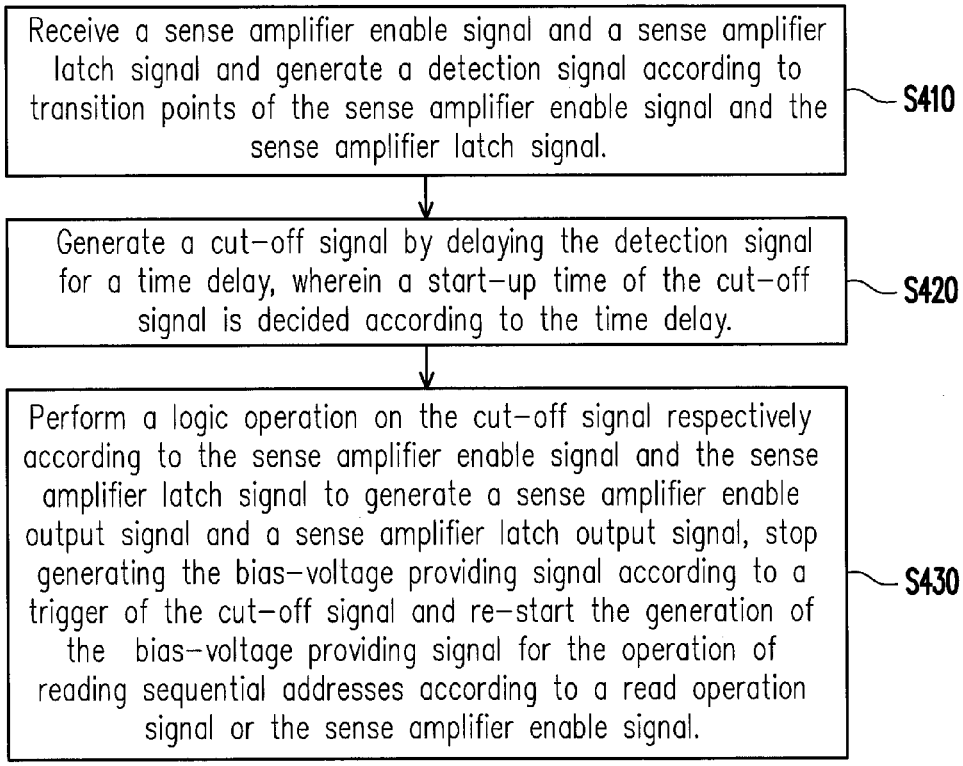
FIG. 4

BIAS VOLTAGE GENERATOR FOR REFERENCE CELL AND BIAS VOLTAGE PROVIDING METHOD THEREFOR

BACKGROUND

1. Field of the Invention

The invention is directed to a serial interface flash memory and more particularly, to a bias voltage generator for a reference cell adapted to a serial interface flash memory.

2. Description of Related Art

In the technical field of the related art, when performing a read operation on a serial interface flash memory, a bias voltage applying operation requiring to be performed on a gate of the reference cell would cause an effect of read disturb. The read disturb is relevant to an amount of the voltage level biased by the gate of the reference cell and the length of the bias voltage. Moreover, the read disturb causes reduction of a read margin of the serial interface flash memory, so that the performance of the serial interface flash memory is influenced.

In the technical field of the related art, the bias voltage applied to the reference cell in the serial interface flash memory is sequentially applied to a gate of the reference cell when the serial interface flash memory performs a read operation, especially an operation of reading sequential addresses. A situation where the bias voltage applying operation is received for a long term commonly leads to deterioration of the memory cell. Specially, when the serial interface flash memory is operated in a low operation frequency, a time length for the bias voltage applied to the reference cell is longer, and as a result, damages caused to the reference cell would become worse.

SUMMARY

The invention is directed to a bias voltage generator for reference cell and a bias voltage providing method therefore, by which read-disturb may be effectively mitigated.

The bias voltage generator of the reference cell of the invention is adapted to a serial interface flash memory. The bias voltage generator includes a data read detector, a cut-off signal generator and an output stage circuit. The data read detector receives a sense amplifier enable signal and a sense amplifier latch signal and generates a detection signal according to transition points of the sense amplifier enable signal and the sense amplifier latch signal. The cut-off signal generator is coupled with the data read detector, receives and delays the detection signal for a time delay to generate a cut-off signal. A start-up time of the cut-off signal is decided according to the time delay. The output stage circuit is coupled with the cut-off signal generator, stops generating the bias-voltage providing signal according to a trigger of the cut-off signal.

The bias voltage providing method for a reference cell of the invention is adapted to a serial interface flash memory. The method includes receiving a sense amplifier enable signal and a sense amplifier latch signal and generating a detection signal according to transition points of the sense amplifier enable signal and the sense amplifier latch signal; generating a cut-off signal by delaying the detection signal for a time delay, wherein a start-up time of the cut-off signal is decided according to the time delay; and stopping generating the bias-voltage providing signal according to a trigger of the cut-off signal.

To sum up, the invention provide the bias voltage generator for the reference cell and the bias voltage providing method therefore, in which when the flash memory is operated in a low frequency, the bias voltage provided to the reference cell may be adaptively cut off, so as to effectively mitigate read disturb of the flash memory.

In order to make the aforementioned and other features and advantages of the present invention more comprehensible, several embodiments accompanied with figures are described in detail below.

BRIEF DESCRIPTION OF THE DRAWINGS

The accompanying drawings are included to provide a further understanding of the present invention, and are incorporated in and constitute a part of this specification. The drawings illustrate embodiments of the present invention and, together with the description, serve to explain the principles of the present invention.

FIG. 3 illustrates the implementation of the pulse generator according to an embodiment of the invention.

FIG. 4 is a flowchart illustrating a bias voltage providing method for a reference cell according to an embodiment of the invention.

DESCRIPTION OF EMBODIMENTS

Figure 1:
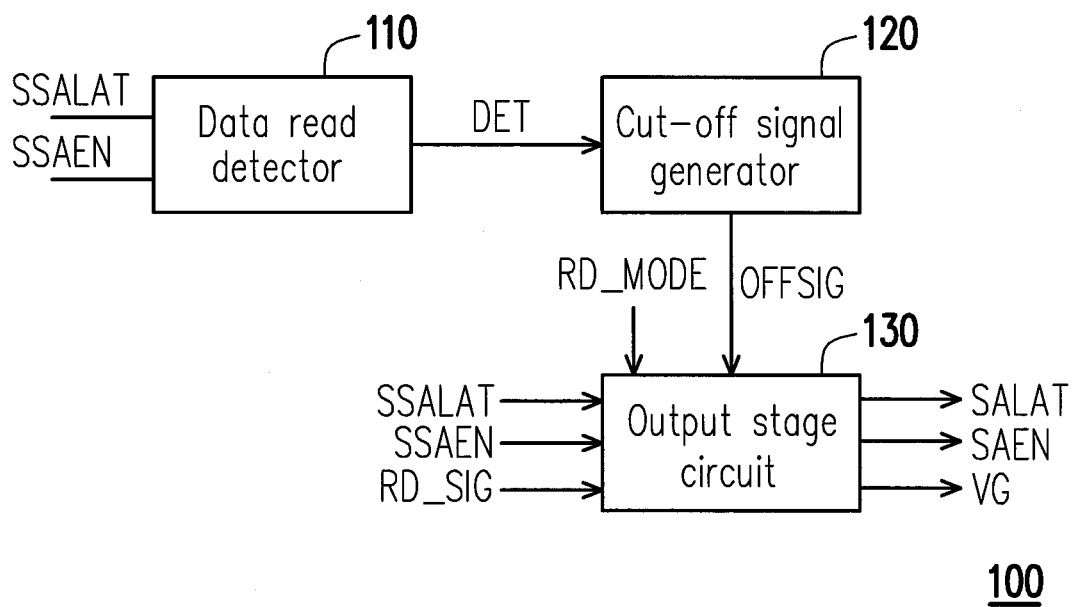
FIG. 1 is a schematic diagram illustrating a bias voltage generator for a reference cell according to an embodiment of the invention.

With reference to FIG. 1, FIG. 1 is a schematic diagram illustrating a bias voltage generator 100 for a reference cell. The bias voltage generator 100 is adapted to a serial interface flash memory, such as a serial peripheral interface (SPI) flash memory. The bias voltage generator 100 includes a data read detector 110, a cut-off signal generator 120 and an output stage circuit 130. The data read detector 110 receives a sense amplifier enable signal SSAEN and a sense amplifier latch signal SSALAT, which are clock signals in a synchronized clock system, and generates a detection signal DET according to transition points of the sense amplifier enable signal SSAEN and the sense amplifier latch signal SSALAT. The cut-off signal generator 120 is coupled with the data read detector 110. The cut-off signal generator 120 receives and delays the detection signal DET for a time delay to generate a cut-off signal OFFSIG. A start-up time of the cut-off signal OFFSIG is decided according to the time delay, and the start-up time does not have to be synchronous with a clock signal CLK. The output stage circuit 130 is coupled with the cut-off signal generator 120. The output stage circuit 130 performs a logic operation on the cut-off signal OFFSIG respectively according to the sense amplifier enable signal SSAEN and the sense amplifier latch signal SSALAT to generate a sense amplifier enable output signal SAEN and a sense amplifier latch output signal SALAT. The output stage circuit 130 also stops generating the bias-voltage providing signal according to the cut-off signal OFFSIG so as to stop the generation of a bias voltage VG. In an embodiment of the invention, the output stage circuit 130 may start to provide the bias voltage VG to the reference cell according to a read mode signal RDMODE and a read operation signal RD_SIG that are received thereby. Therein, the read operation signal RD_SIG may be selected from a sequential read signal that sequentially occurs or an address trigger count signal generated accompanying with the sequential read signal. In a possible embodiment, the read operation signal RD_SIG may be replaced with the sense amplifier enable signal SSAEN or the cut-off signal OFFSIG.

Moreover, when a read operation of the serial interface flash memory is operated in a low frequency, the output stage circuit 130 will stop the generation of the bias voltage VG according to the generated cut-off signal OFFSIG, and when an operation of reading sequential addresses is performed, the output stage circuit 130 may re-start the operation of providing the bias voltage VG to the reference cell according to the read operation signal RD_SIG or the reset cut-off signal OFFSIG. Therefore, in the invention, the degradation resulted from the reference cell receiving the bias voltage for a long term may be prevented and the reliability of the memory may be improved.

It should be noted that the data read detector 110 generates detection signal DET according to the transition points of the sense amplifier latch output signal SSALAT and the sense amplifier enable signal SSAEN. In the present embodiment, the detection signal DET is a synchronized clock signal. The data read detector 110 resets the detection signal DET to be equal to a first logic level according to an enabled transition point of the sense amplifier enable signal SSAEN, and the data read detector 110 sets the detection signal DET to be equal to a second logic level according to an enabled transition point of the sense amplifier latch signal SSALAT. The first and the second logic level are complementary. The aforementioned enabled transition point of the sense amplifier enable signal SSAEN may be a transition point at which the state is transited from a logic low level to a logic high level. Likewise, the enabled transition point of the sense amplifier latch signal SSALAT may be a transition point at which the state is transited from a logic low level to a logic high level. Certainly, the enabled transition point of the sense amplifier enable signal SSAEN may be a transition point at which the state is transited from a logic high level to a logic low level. Likewise, the enabled transition point of the sense amplifier latch signal SSALAT may be a transition point at which the state is transited from a logic high level to a logic low level. That is to way, the logic levels of the sense amplifier latch signal SSALAT and the sense amplifier enable signal SSAEN after being enabled may be decided by the designer without any specified limitations.

It is to be mentioned that a delay quantity of the time delay executed by the cut-off signal generator 120 is not relevant to the clock signal CLK of the serial interface flash memory. In other words, the cut-off signal OFFSIG generated according to the time delay does not have to be synchronous with the clock signal CLK at a falling edge. Accordingly, the sense amplifier enable output signal SAEN and the sense amplifier latch output signal SALAT generated according to the cut-off signal OFFSIG also do not have to be synchronous with the sense amplifier enable signal SSAEN and the sense amplifier latch signal SSALAT at the falling edge.

Figure 2A:
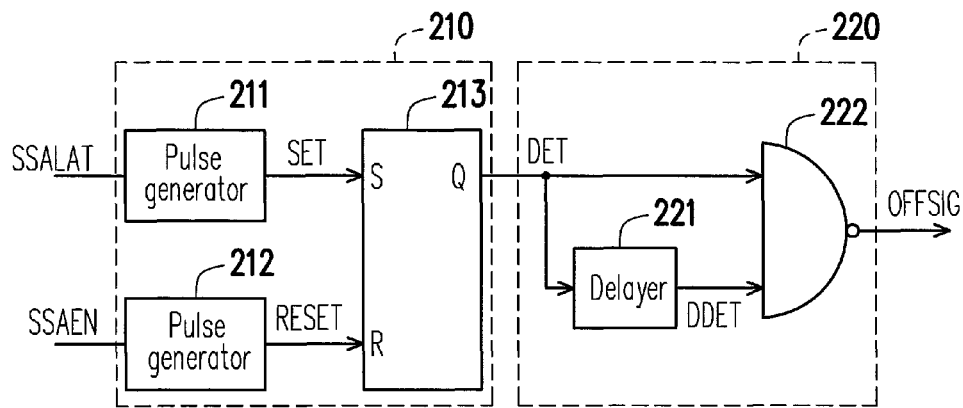
FIG. 2A is a schematic diagram illustrating a bias voltage generator according to another embodiment of the invention.

Hereinafter, with reference to FIG. 2A, FIG. 2A is a schematic diagram illustrating a bias voltage generator according to another embodiment of the invention, where the implementation of a data read detector and a cut-off signal generator are illustrated. In the present embodiment, a data read detector 210 includes pulse generators 211 and 212 and a set-reset (SR) latch 213. The pulse generator 211 generates a pulse signal SET according to the enabled transition point of the sense amplifier latch signal SSALAT, while the pulse generator 212 generates a pulse signal RESET according to the enabled transition point of the sense amplifier enable signal SSAEN. The SR latch 213 has a reset terminal R, a set terminal S and an output terminal Q. The set terminal S and the reset terminal R of the SR latch 213 are respectively coupled to the pulse generators 211 and 212. The output terminal Q of the SR latch 213 generates the detection signal DET.

The pulse generators 211 and 212 may be respectively constructed through so-called one shot circuits. It is to be mentioned that the pulse signals SET and RESET respectively generated by the pulse generators 211 and 212 have pulse widths greater than ½ period of the clock signal CLK, or the pulse widths are between ½ period and one period of the clock signal CLK.

The cut-off signal generator 220 includes a delayer 221 and a NAND gate 222. The delayer 221 is coupled to the output terminal Q of the SR latch 213 to receive the detection signal DET. The delayer 221 also delays the detection signal DET for a time delay to generate a delayed detection signal DDET. The NAND gate 222 is coupled to the output terminal Q of the SR latch 213 and the delayer 221 and receives the delayed detection signal DDET and the detection signal DET for performing the logic operation to generate or reset the cut-off signal OFFSIG.

Figure 2B:
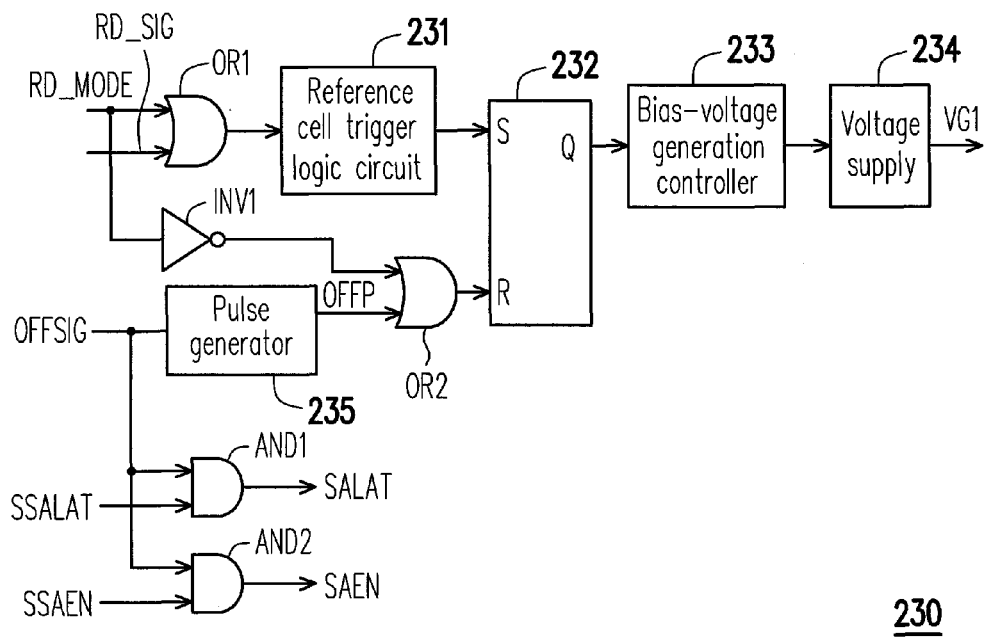
FIG. 2B illustrates the implementation of the output stage circuit according to an embodiment of the invention.

Hereinafter, with reference to FIG. 2B, FIG. 2B illustrates the implementation of the output stage circuit according to an embodiment of the invention. As illustrated in FIG. 2B, an output stage circuit 230 includes OR gates OR1 and OR2, an inverter INV1, a reference cell trigger logic circuit 231, a SR latch 232, a bias-voltage generation controller 233, a voltage supply 234, a pulse generator 235 and AND gates AND1 and AND2. An input terminal of the OR gate OR1 receives the read mode signal RD_MODE, and the other input terminal of the OR gate OR1 receives the read operation signal RD_SIG or the sense amplifier enable signal SSAEN. The reference cell trigger logic circuit 231 is coupled to an output terminal of the OR gate OR1 to receive a signal on the output terminal of the OR gate OR1. An input terminal of the inverter INV1 receives the read mode signal RD_MODE, and an output terminal of the inverter INV1 is coupled to an input terminal of the OR gate OR2. The other input terminal of the OR gate OR2 is coupled to an output terminal of the pulse generator 235. An input terminal of the pulse generator 235 receives the cut-off signal OFFSIG. Output terminals of the OR gate OR2 and the reference cell trigger logic circuit 231 are respectively coupled to a reset terminal R and a set terminal S of the SR latch 232. An output terminal of the SR latch 232 is coupled to the bias-voltage generation controller 233. The bias-voltage generation controller 233 provides a signal to the voltage supply 234 according to the signal on the output terminal of the SR latch 232 to control the voltage supply 234 to start to generate or stop generating a bias voltage VG1.

Meanwhile, input terminals of the AND gate AND1 respectively receive the cut-off signal OFFSIG and the sense amplifier latch signal SSALAT, such that the AND gate AND1 generates the sense amplifier latch output signal SALAT. Input terminals of the AND gate AND2 respectively receive the cut-off signal OFFSIG and the sense amplifier enable signal SSAEN, such that the AND gate AND2 generates the sense amplifier enable output signal SAEN.

In the implementation of the present embodiment, the read operation signal RD_SIG is a signal generated when the flash memory perform a sequential data read operation. That is to say, the read operation signal RD_SIG generates regular pulses having a constant clock sequence accompanying with the read operation. The read mode signal RD_MODE is a signal used to instruct the flash memory to perform the data read operation. In brief, when the read mode signal RD_MODE is in an enabled state (e.g. at a logic high level), it represents that the flash memory continues performing the data read operation.

Figure 2C:
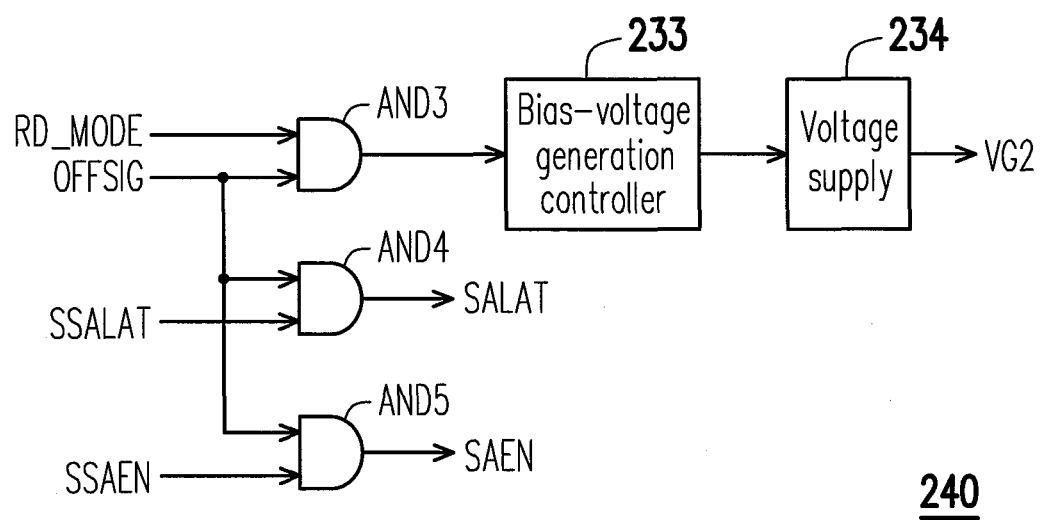
FIG. 2C illustrates the implementation of the output stage circuit according to another embodiment of the invention.

Hereinafter, with reference to FIG. 2C, FIG. 2C illustrates the implementation of the output stage circuit according to another embodiment of the invention. As illustrated in FIG., an output stage circuit 240 includes AND gates AND3~AND5, the bias-voltage generation controller 233 and the voltage supply 234. The AND gate AND3 receives the read mode signal RD_MODE and the cut-off signal OFFSIG. The AND gate AND4 receives the cut-off signal OFFSIG and sense amplifier latch signal SSALAT to generate the sense amplifier latch output signal SALAT. The AND gate AND5 receives the cut-off signal OFFSIG and the sense amplifier enable signal SSAEN to generate the sense amplifier enable output signal SAEN.

The bias-voltage generation controller 233 is coupled to an output terminal of the AND gate AND3 and generates the bias-voltage providing signal according to a signal on the output terminal of the AND gate AND3. The bias-voltage generation controller 233 also provides the bias-voltage providing signal to the voltage supply 234 to control the voltage supply 234 to start to generate or stop generating a bias voltage VG2.

Figure 2D:
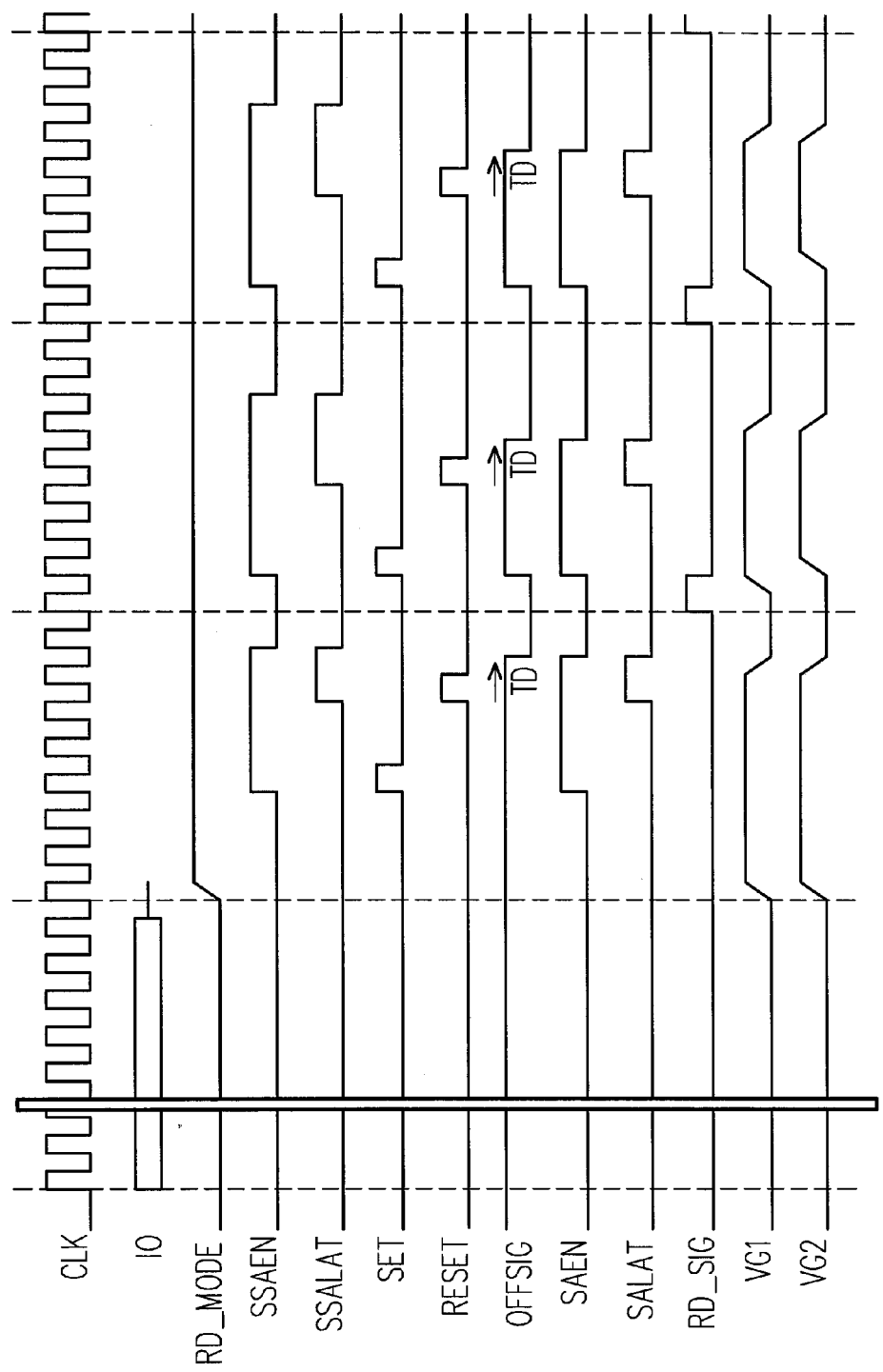
FIG. 2D is a chart illustrating waveforms of the bias voltage generator according to an embodiment of the invention.

FIG. 2D is a chart illustrating waveforms of the bias voltage generator according to an embodiment of the invention. With reference to FIG. 2D together with FIG. 2A~FIG. 2D, when the serial flash memory in the data read operation, i.e., when the serial flash memory receives a transmitted command signal through an input/output signal IO, the bias voltages VG (VG1 and VG2) illustrated on different embodiments may be provided to the gate of the reference cell. In the embodiment illustrated in FIG. 2B, the cut-off signal OFFSIG generated by the time delay is used to stop providing the bias voltage VG1, while the read operation signal RD_SIG is used to re-start to provide the bias voltage VG1. Likewise, in the embodiment illustrated in FIG. 2C, the cut-off signal OFFSIG is directly used to control the supply or suspension of the bias voltage VG2.

The pulse signals SET and RESET are generated respectively according to the sense amplifier latch signal SSALAT and the sense amplifier enable signal SSAEN that are synchronous with the clock signal CLK for providing a system frequency at a rising edge. Meanwhile, the pulse signals SET and RESET have pulse widths greater than ½ period of the clock signal CLK, or the pulse widths are between ½ period and one period of the clock signal CLK.

The cut-off signal OFFSIG is generated by the cut-off signal generator 220 and started up through a pulse width of the time delay TD (e.g. a state of the cut-off signal OFFSIG is transited to a logic high level). The sense amplifier latch output signal SALAT and the sense amplifier enable output signal SAEN respectively corresponding to the sense amplifier latch signal SSALAT and the sense amplifier enable signal SSAEN are generated based on the cut-off signal OFFSIG through the AND gates AND1 and AND2. A cut-off signal pulse OFFP is generated by the pulse generator 235 based on the cut-off signal OFFSIG, and the cut-off signal pulse OFFP has a pulse width greater than ½ a period of the clock signal CLK, or the pulse width is between ½ period and one period of the clock signal CLK. Referring to FIG. 2D, in a state where the read mode signal RD_MODE is equal to the logic high level, the pulse signal RESET has a waveform identical to a waveform of the cut-off signal pulse OFFP.

It should be noted that the bias voltages VG1 and VG2 may be adaptively closed by a positive pulse width of the periodically generated cut-off signal pulse OFFP. That is to say, during a read process, the gate of the reference cell of the present embodiment is not applied with the bias voltage for a long term, which results in the reliability reduction of the reference cell. Particularly, in a state where the system frequency provided by the clock signal CLK is lower, the bias voltages VG1 and VG2 may be adaptively cut off and will not be provided to the gate of the reference cell for a long term.

Now, with reference to FIG. 3, FIG. 3 illustrates the implementation of the pulse generator 211 according to an embodiment of the invention. The present embodiment may be likewise applied to the pulse generator 212 and thus, will not be repeatedly described any longer. In the present embodiment, the pulse generator 211 includes D-type flip flops DFF1 and DFF2, an inverter INV2, a NOR gate NOR1 and an AND gate AND6. In the D-type flip flop DFF1, a data terminal D receives a power supply voltage VDD, a clock terminal CK is coupled to an output terminal of the inverter INV2 and receives the clock signal CLK, and a reset terminal R receives an input signal IN. In the D-type flip flop DFF2, a data terminal D receives the power supply voltage VDD, a clock terminal CK is coupled to the input terminal of the inverter INV2 and receives the clock signal CLK, a reset terminal R receives the input signal IN. Output terminals of the D-type flip flops DFF1 and DFF2 are coupled to input terminals of the NOR gate NOR1.

Input terminals of the AND gate AND6 are respectively coupled to an output terminal of the NOR gate NOR1 and the input signal IN. The input signal IN may be the sense amplifier latch signal SSALAT. The output terminal of the AND gate AND6 generates the pulse signal SET. In this case, the pulse signal SET has a pulse width greater than ½ period of the clock signal CLK, or the pulse widths are between ½ period and one period of the clock signal CLK. An end point (e.g. a falling edge) of the pulse signal SET may be not synchronous with the clock signal CLK.

With reference to FIG. 4, FIG. 4 is a flowchart illustrating a bias voltage providing method for a reference cell according to an embodiment of the invention. The method includes steps as follows. First, in step S410, a sense amplifier enable signal and a sense amplifier latch signal are received, and a detection signal is generated according to transition points of the sense amplifier enable signal and the sense amplifier latch signal. In step S420, a cut-off signal is generated by delaying the detection signal for a time delay, wherein a start-up time of the cut-off signal is decided according to the time delay. In step S430, a logic operation is performed on the cut-off signal respectively according to the sense amplifier enable signal and the sense amplifier latch signal to generate a sense amplifier enable output signal and a sense amplifier latch output signal. According to a trigger of the cut-off signal, the bias-voltage providing signal is stopped. As for an operation of reading sequential addresses, the generation of the bias-voltage providing signal is re-started according to a read operation signal or a sense amplifier enable signal.

Details for performing the bias voltage providing method for the reference cell may be referred to in the afore-described embodiments and implementation and thus, will not be repeatedly described any longer.

Based on the above, in the invention, the bias voltage provided to the gate of the reference cell are adaptively cut off though providing the cut-off signal that is not synchronous with the clock signal of the serial interface flash memory. By doing so, the reference cell of the serial interface flash memory will not receive the bias voltage for a long term, which facilitates in improving the reliability of the reference cell and effectively mitigating the read disturb of the flash memory.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A bias voltage generator for a reference cell, adapted to a serial interface flash memory, comprising:
    a data read detector, receiving a sense amplifier enable signal and a sense amplifier latch signal and generating a detection signal according to transition points of the sense amplifier enable signal and the sense amplifier latch signal;
    a cut-off signal generator, coupled with the data read detector, receiving and delaying the detection signal for a time delay to generate a cut-off signal, wherein a start-up time of the cut-off signal is decided according to the time delay; and
    an output stage circuit, coupled with the cut-off signal generator and stopping generating a bias-voltage providing signal according to a trigger of the cut-off signal.

2. The bias voltage generator for the reference cell according to claim 1, wherein the output stage circuit re-provides the bias-voltage providing signal according to a reset of the cut-off signal or a read operation signal.

3. The bias voltage generator for the reference cell according to claim 2, wherein the read operation signal is a sequential read signal, an address trigger count signal generated accompanying with the sequential read signal, the sense amplifier enable signal or the cut-off signal.

4. The bias voltage generator for the reference cell according to claim 1, wherein the bias voltage generator starts to provide or stops providing a bias voltage to a gate of the reference cell of the serial interface flash memory according to the bias-voltage providing signal.

5. The bias voltage generator for the reference cell according to claim 1, wherein the data read detector resets the detection signal to be equal to a first logic level according to an enabled transition point of the sense amplifier enable signal and sets the detection signal to be equal to a second logic level according to an enabled transition point of the sense amplifier latch signal, wherein the first and the second logic levels are complementary.

6. The bias voltage generator for the reference cell according to claim 1, wherein the data read detector comprises:
    a first pulse generator, generating a first pulse signal according to the enabled transition point of the sense amplifier latch signal;
    a second pulse generator, generating a second pulse signal according to the enabled transition point of the sense amplifier enable signal; and
    a set-reset (SR) latch, having a reset terminal, a set terminal and an output terminal, wherein the set terminal and the reset terminal are respectively coupled with the first and the second pulse generators, and the output terminal generates the detection signal.

7. The bias voltage generator for the reference cell according to claim 5, wherein each of the first and the second pulse generator comprises:
    a first D-type flip flop, having a clock terminal, a data terminal, a reset terminal and an output terminal, wherein the data terminal is coupled to a power supply voltage, and the reset terminal receives the sense amplifier enable signal or the sense amplifier latch signal;
    a second D-type flip flop, having a clock terminal, a data terminal, a reset terminal and an output terminal, wherein the data terminal is coupled to the power supply voltage, the clock terminal receives a clock signal, and the reset terminal is coupled to the reset terminal of the first D-type flip flop;
    a first inverter, having an input terminal receiving the clock signal and an output terminal coupled to the clock terminal of the first D-type flip flop;
    a NOR gate, having two terminals respectively coupled with the output terminals of the first and the second D-type flip flops; and
    a first AND gate, having two terminals respectively coupled to the reset terminal of the first D-type flip flop and the output terminal of the NOR gate, wherein an output terminal of the first AND gate generates the first or the second pulse signal.

8. The bias voltage generator for the reference cell according to claim 1, wherein the cut-off signal generator delays the detection signal to generate a delayed detection signal, and the cut-off signal generator generates the cut-off signal according to the detection signal and the delayed detection signal.

9. The bias voltage generator for the reference cell according to claim 8, wherein the cut-off signal generator comprises:
    a delayer, coupled with the data read detector to receive the detection signal and delaying the detection signal for the time delay to generate the delayed detection signal; and
    a NAND gate, coupled with the data read detector and the delayer and receiving the delayed detection signal and the detection signal to generate the cut-off signal.

10. The bias voltage generator for the reference cell according to claim 1, wherein the output stage circuit performs a logic operation on the cut-off signal respectively according to the sense amplifier enable signal and the sense amplifier latch signal to generate a sense amplifier enable output signal and a sense amplifier latch output signal.

11. The bias voltage generator for the reference cell according to claim 10, wherein the sense amplifier enable output signal and the sense amplifier latch output signal are not synchronous with the sense amplifier enable signal and the sense amplifier latch signal at a falling edge.

12. The bias voltage generator for the reference cell according to claim 11, wherein the output stage circuit comprises:
    a first AND gate, receiving a read mode signal and the cut-off signal;
    a second AND gate, receiving the cut-off signal and the sense amplifier latch signal and generating the sense amplifier latch output signal;
    a third AND gate, receiving the cut-off signal and the sense amplifier enable signal and generating the sense amplifier enable output signal;
    a bias-voltage generation controller, coupled with the output terminal of the first AND gate and generating the bias-voltage providing signal according to the output terminal of the first AND gate; and
    a voltage supply, coupled with the bias-voltage generation controller, receiving the bias-voltage providing signal and providing a bias voltage according to the bias-voltage providing signal.

13. The bias voltage generator for the reference cell according to claim 11, wherein the output stage circuit comprises:

a first OR gate, having an input terminal receiving a read mode signal and another input terminal receiving a read operation signal;

a reference cell trigger logic circuit, coupled to the output terminal of the first OR gate;

an inverter, having an input terminal receiving the read mode signal;

a pulse generator, receiving the cut-off signal and generating a cut-off signal pulse according to the cut-off signal;

a second OR gate, having input terminals respectively coupled to the output terminals of the inverter and the pulse generator;

a first AND gate, having a first and a second input terminals respectively receiving the cut-off signal and the sense amplifier latch signal and an output terminal generating the sense amplifier latch output signal;

a second AND gate, having a first and a second input terminals respectively receiving the cut-off signal and the sense amplifier enable signal and an output terminal generating the sense amplifier enable output signal;

a SR latch, having a reset terminal, a set terminal and an output terminal, wherein the reset terminal and the set terminal of the SR latch are respectively coupled to the output terminal of the second OR gate and the reference cell trigger logic circuit;

a bias-voltage generation controller, coupled with the output terminal of the SR latch and generating the bias-voltage providing signal according to a signal of the output terminal of the SR latch; and a voltage supply, coupled with the bias-voltage generation controller to receive the bias-voltage providing signal and starts to provide or stop providing the bias voltage to a gate of the reference cell according to the bias-voltage providing signal.

14. A bias voltage providing method for a reference cell, adapted to a serial interface flash memory, comprising:

receiving a sense amplifier enable signal and a sense amplifier latch signal and generating a detection signal according to transition points of the sense amplifier enable signal and the sense amplifier latch signal;

generating a cut-off signal by delaying the detection signal for a time delay, wherein a start-up time of the cut-off signal is decided according to the time delay; and stopping generating the bias-voltage providing signal according to a trigger of the cut-off signal.

15. The method according to claim 14, further comprising:
performing a logic operation on the cut-off signal respectively according to the sense amplifier enable signal and the sense amplifier latch signal to generate a sense amplifier enable output signal and a sense amplifier latch output signal.

16. The method according to claim 15, wherein the sense amplifier enable output signal and the sense amplifier latch output signal are not synchronous with the sense amplifier enable signal and the sense amplifier latch signal at a falling edge.

17. The method according to claim 14, wherein the step of stopping the generation of the bias-voltage providing signal according to the trigger of the cut-off signal further comprises:
re-starting the generation of the bias-voltage providing signal according to a reset of the cut-off signal or a read operation signal.

18. The method according to claim 14, further comprising:
providing a bias voltage to the gate of the reference cell of the serial interface flash memory according to the bias-voltage providing signal.

19. The method according to claim 14, wherein the step of generating the detection signal according to the transition points of the sense amplifier enable signal and the sense amplifier latch signal comprises:
resetting the detection signal to be equal to a first logic level according to an enabled transition point of the sense amplifier enable signal; and
setting the detection signal to be equal to a second logic level according to an enabled transition point of the sense amplifier latch signal,
wherein the first and the second logic levels are complementary.

20. The method according to claim 14, wherein the step of generating the cut-off signal by delaying the detection signal for the time delay comprises:
delaying the detection signal to generate a delayed detection signal; and
generating the cut-off signal according to the detection signal and the delayed detection signal.

\* \* \* \* \*